United States Patent
Takai

(10) Patent No.: US 8,493,377 B2
(45) Date of Patent: Jul. 23, 2013

(54) DISPLAY DEVICE

(75) Inventor: Tomoharu Takai, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 417 days.

(21) Appl. No.: 12/766,410

(22) Filed: Apr. 23, 2010

(65) Prior Publication Data

US 2010/0277457 A1  Nov. 4, 2010

(30) Foreign Application Priority Data

Apr. 30, 2009  (JP) ................................. 2009-110369

(51) Int. Cl.
G06F 3/038 (2006.01)
G09G 5/00 (2006.01)

(52) U.S. Cl.
USPC ........................................... 345/211; 345/98

(58) Field of Classification Search
USPC .... 345/98, 211; 315/169.1; 349/19; 359/245, 359/265
See application file for complete search history.

(56) References Cited

U.S. PATENT DOCUMENTS

| 6,297,791 B1 * | 10/2001 | Naito et al. ..................... 345/89 |
| 6,307,530 B1 | 10/2001 | Cho ............................... 345/87 |
| 2002/0075253 A1 * | 6/2002 | Park et al. ..................... 345/211 |
| 2005/0007500 A1 | 1/2005 | Lin et al. ...................... 348/790 |

FOREIGN PATENT DOCUMENTS

EP  1 901 110 A2  3/2008
JP  2006-113301 A  4/2006

* cited by examiner

Primary Examiner — Kevin M Nguyen
Assistant Examiner — Kenneth B Lee, Jr.
(74) Attorney, Agent, or Firm — Morgan, Lewis & Bockius LLP

(57) ABSTRACT

A display device includes a digital board upon which a video signal processing circuit is formed, a driver board upon which a driver circuit is formed, and a power supply board upon which a power supply circuit is formed. The video signal processing circuit generates one screen of image data on the basis of a video signal that is inputted from an input source. And the driver circuit displays an image based upon this image data upon a display. Moreover, the power supply circuit produces a power supply voltage from a commercial power supply. The power supply board supplies the power supply voltage to the digital board via a first power supply cable, and also supplies the power supply voltage to the driver board via a second power supply cable.

3 Claims, 5 Drawing Sheets

DISPLAY DEVICE

CROSS REFERENCE

This Nonprovisional application claims priority under 35 U.S.C. §119(a) on Patent Application No. 2009-110369 filed in Japan on Apr. 30, 2009, the entire contents of which are hereby incorporated by reference.

BACKGROUND OF THE INVENTION

The present invention relates to a panel type display device such as a liquid crystal television or a plasma television or the like.

In recent years, panel type display devices such as liquid crystal televisions or plasma televisions or the like have become generally widespread. In the following, a panel type display device will be explained by presenting the board arrangement of a liquid crystal television as a representative example.

FIG. 1 is a figure showing the internal board arrangement at the rear of a prior art type liquid crystal television. At the rear of a liquid crystal display (LCD), there are disposed a digital board A, a power supply board B, an audio board C, and a driver board X.

The power supply board B converts the voltage of the commercial AC power supply into a DC power supply voltage, and generates power supply voltages of various types based upon this DC power supply voltage. And the power supply board B supplies these power supply voltages via power supply cables to various circuits formed upon the digital board A and the audio board C. Here, the digital board A is connected to the power supply board B with a power supply cable 32. Moreover, the driver board X is connected to the digital board A with a power supply cable 39. And the audio board C is connected to the power supply board B with a power supply cable 31. Power supply voltage is supplied to the driver board X via the power supply cable 32, the digital board A, and the power supply cable 39. Furthermore, this power supply voltage is also supplied to a TCP (tape carrier package) group Y via the driver board X.

With a tuner 10, the digital board A extracts a broadcast television signal upon a selected channel from a broadcast television signal that is received via an antenna. Furthermore, with a video signal processing circuit, the digital board A performs separation of a video signal and an audio signal from this broadcast television signal. And the digital board A outputs the audio signal that it has thus separated to the audio board C via a signal cable 41. Moreover, with this video signal processing circuit, the digital board A generates one LCD screen of image data on the basis of the video signal that it has thus separated. And the digital board A generates a panel drive signal on the basis of this image data. The digital board A then outputs this panel drive signal that it has thus generated to the driver board X via a signal cable 42. This panel drive signal is also inputted to the TCP group Y via the driver board X.

A plurality of source driver ICs that are incorporated in a driver circuit are mounted upon the driver board X. Furthermore, the driver board X is connected to the flexible printed circuit Y upon which a plurality of gate driver ICs that are incorporated in this driver circuit are mounted. The plurality of source driver ICs are driven by source bus lines for the LCD. And the plurality of gate driver ICs are driven by gate bus lines for the LCD. On the basis of the panel drive signal, the driver circuit drives each pixel of the LCD, which is made up of an array of pixels. By doing this, the driver circuit causes video to be displayed upon the screen of the LCD on the basis of the image data.

The digital board A is connected to the audio board C via the signal cable 41, and thus the audio signal from the digital board A is inputted. The audio board C A/D converts the digital audio signal into an analog audio signal, which it outputs from a speaker.

Now, a manufacturer who manufactures a display device such as a liquid crystal television or the like typically purchases a liquid crystal panel (or a plasma panel) from another company, and manufactures the complete display device in his own works by connecting electronic components such as a driver circuit and a video signal processing circuit and so on to this liquid crystal panel (or plasma panel). In order to pursue cost reduction, such a manufacturer often changes over from one seller of liquid crystal panels (or plasma panels) to another who can supply products at a cheaper price.

It should be understood that a liquid crystal television receiver is proposed in Japanese Laid-Open Patent Publication 2006-113301. The liquid crystal television receiver has a source driver and a gate driver.

However, the above described driver circuit has a circuit structure which is different for each panel manufacturer and each panel screen size. Due to this, with prior art display devices, for each maker who manufactures panels and for each panel screen size, it has been necessary to design a special digital board A corresponding to the driver board X upon which the driver circuit is mounted and to the TCP group Y. This has caused increase of the manufacturing cost.

An object of the present invention is to provide a display device with which the digital board is standardized, so that it is possible to anticipate reduction of the manufacturing cost.

SUMMARY OF THE INVENTION

The display device according to the present invention includes a digital board upon which is formed a video signal processing circuit, a driver board upon which is formed a driver circuit, and a power supply board upon which is formed a power supply circuit. The driver board is connected to the digital board by a signal cable. With this structure, the video signal processing circuit generates one screen of image data on the basis of a video signal that is inputted from an input source, and generates a drive signal on the basis of the image data. Moreover, the driver circuit drives each pixel of a display on the basis of the drive signal inputted from the digital board via the signal cable. Thereby the driver circuit displays an image based upon the image data upon the display. Furthermore, the power supply circuit produces a power supply voltage from a commercial power supply, for driving the video signal processing circuit of the digital board and the driver circuit of the driver board.

Yet further, the digital board is connected to the power supply board via a first power supply cable. And the driver board is connected to the power supply board via a second power supply cable. With this structure, the power supply voltage is supplied to the digital board via the first power supply cable. Moreover, the power supply board supplies the power supply voltage to the driver board via the second power supply cable directly, and not via the digital board.

DETAILED DESCRIPTION OF THE INVENTION

In the following, a liquid crystal television which is an embodiment of the present invention will be explained.

Figure 1:
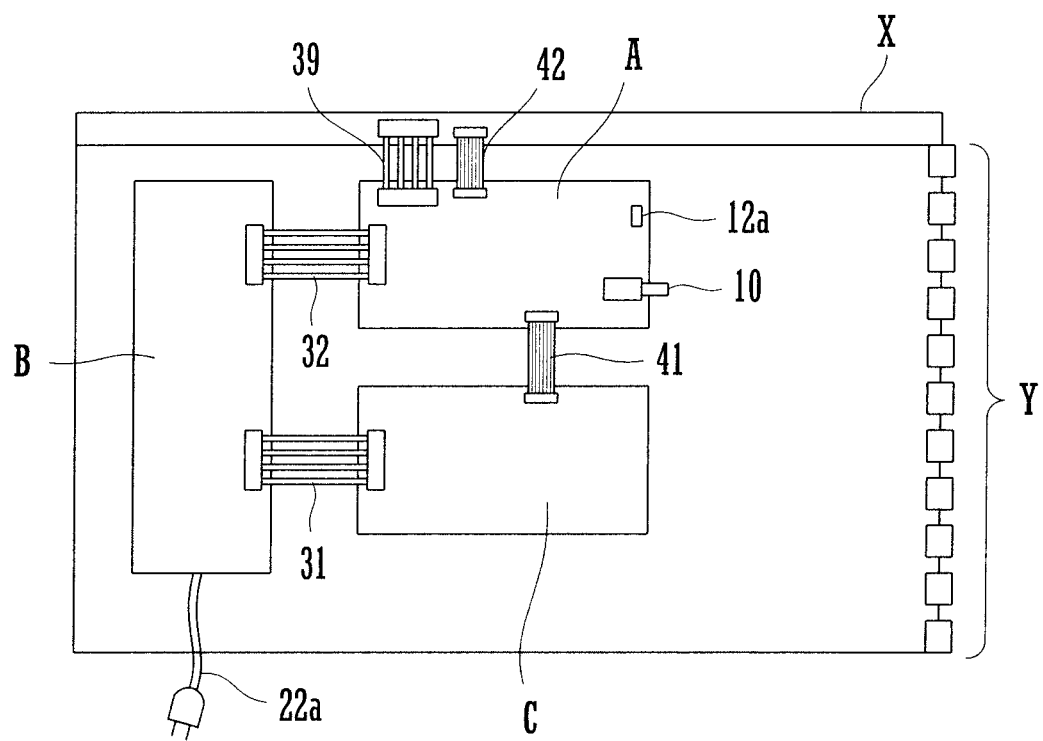
FIG. 1 shows an arrangement of boards inside the rear of a prior art liquid crystal television.
Figure 2:
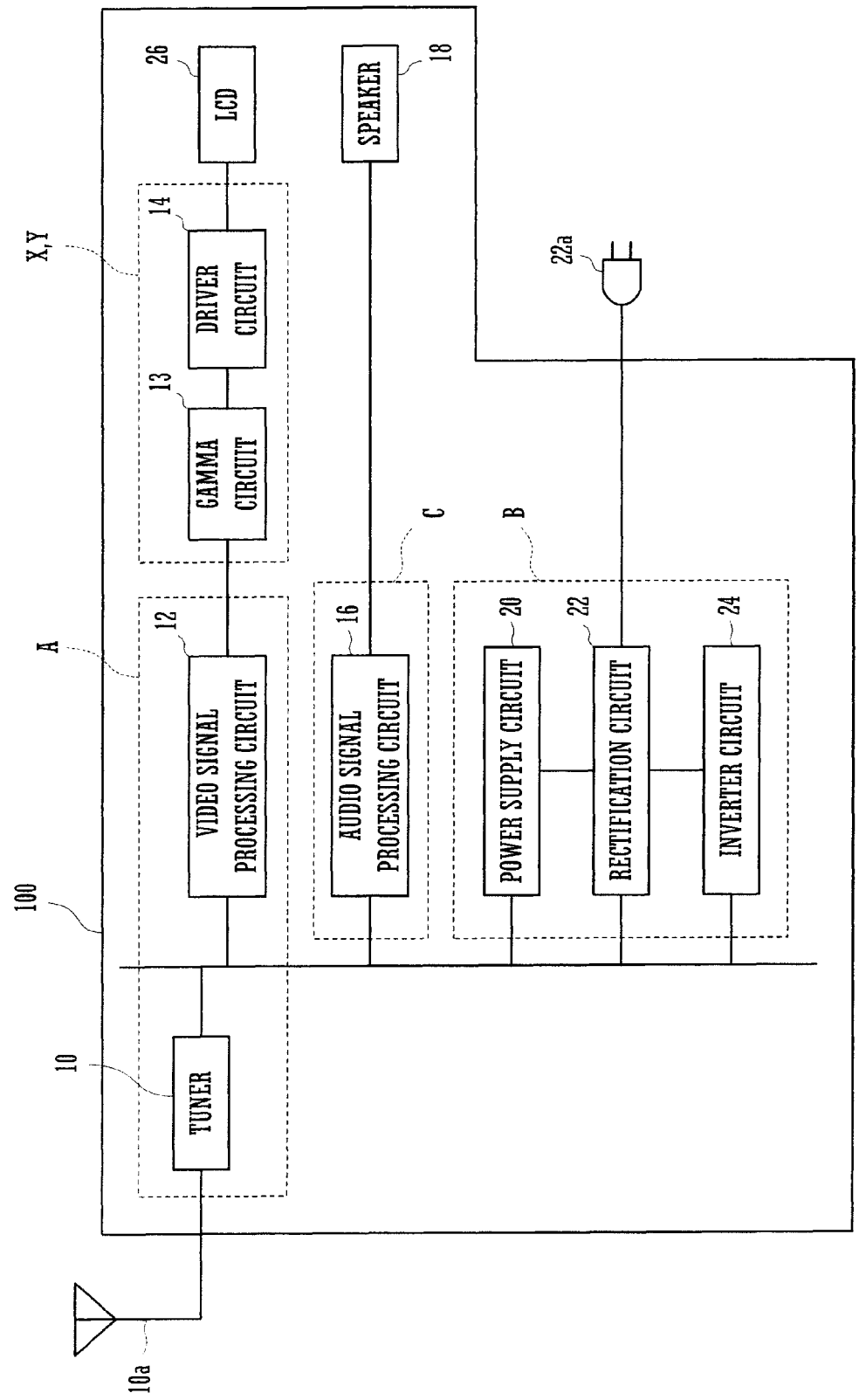
FIG. 2 is a block diagram showing the main structure of a liquid crystal television according to an embodiment of the present invention.

FIG. 2 is a block diagram showing the main structure of this liquid crystal television that is an embodiment of the present invention. This liquid crystal television 100 comprises a tuner 10, a video signal processing circuit 12, a liquid crystal display (LCD) 26, an audio processing circuit 16, a speaker 18, a power supply circuit 20, a rectification circuit 22, and an inverter circuit 24.

From a broadcast television signal that is received via an antenna 10a, the tuner 10 extracts a broadcast television signal upon a channel that is selected, and outputs this signal to the video signal processing circuit 12. This received broadcast television signal may be an analog broadcast or may be a digital broadcast. In the case that an analog broadcast television signal is received, this analog broadcast television signal is A/D converted by the video signal processing circuit 12, as will be described hereinafter.

The video signal processing circuit 12 is a single-chip IC that performs processing digitally. This video signal processing circuit 12 comprises an A/D conversion section, a video decoder (V/D), a scaler, and a timing controller (Tcont). Furthermore, the video signal processing circuit 12 comprises a composite terminal at which a composite analog signal is inputted, and an HDMI (registered trademark) terminal 12a at which digital video and audio signals can be inputted and outputted.

When the A/D conversion unit described above receives an analog broadcast television signal with the tuner 10, it converts the analog video and audio signals that are thus inputted into digital video and audio signals. The video decoder described above separates the video signal and the audio signal from the digital video and audio signal (i.e. the broadcast television signal) inputted directly from the tuner 10, or inputted via the A/D conversion unit. And the video decoder described above outputs the audio signal that has been separated to the audio processing circuit 16, and also demodulates the video signal that has been separated into color signals for the three primary colors R, G, and B. Furthermore, the video decoder described above performs color intensity adjustment, contrast adjustment, tint adjustment, brightness adjustment, color adjustment such as skin color correction and so on, monochrome extension adjustment, delay adjustment, sharpness adjustment, and so on upon these RGB video signals, and also performs image quality adjustment processing such as noise elimination and the like. And the video decoder described above outputs the resulting video signal to the scaler described above. This scaler then converts this video signal, which is in interlaced format, to a video signal in progressive format. The above described scaler then performs scaling processing upon this video signal that has been converted, so as to make it match the number of pixels of the LCD 26 (whose horizontal to vertical ratio is supposed to be m:n). Thereafter, the above described scaler generates data from the video signal for one screen display image upon the LCD 26, and outputs this image data to the timing controller. And the timing controller generates a panel drive signal on the basis of this image data that has been inputted, and outputs this panel drive signal to a gamma circuit 13.

The gamma circuit 13 performs gamma correction upon the panel drive signal that has been inputted, and outputs the result to the driver circuit 14.

It should be understood that the gamma characteristic is a characteristic that shows the correlation relationship between the color data in the inputted image data and what corresponding brightness is outputted upon the display, etc. This gamma characteristic changes according to the characteristics of the panel. In other words, the gamma characteristic is different for each panel manufacturer and for each screen size. Due to this, in a prior art display device in which the gamma circuit that performs gamma correction is built upon a digital board, it has been necessary to design a dedicated digital board for each panel manufacturer, and for each panel screen size.

The driver circuit 14 comprises a plurality of source driver ICs that drive source bus lines of the LCD 26, and a plurality of gate driver ICs that drive gate bus lines of the LCD 26. The LCD 26 is a LCD module that includes a liquid crystal panel and a backlight. On the basis of the panel drive signal, the driver circuit 14 drives each pixel of the LCD 26, which is made as a pixel array. Due to this, the driver circuit 14 displays video based upon the image data on the screen of the LCD 26.

And, when the digital audio signal is inputted, the audio processing circuit 16 A/D converts this digital audio signal to an analog audio signal. Furthermore, after having amplified this analog audio signal with an internal amplifier, the audio processing circuit 16 outputs it as audio to the speaker 18.

The rectification circuit 22 inputs the AC power supply voltage from the commercial power supply via an AC power supply cable 22a, and converts this AC power supply voltage to a DC power supply voltage which it supplies to the inverter circuit 24 and to the power supply circuit 20. On the basis of this DC power supply voltage supplied from the rectification circuit 22, the power supply circuit 20 generates power supply voltages of various types for driving various circuits, including the video signal processing circuit 12 of the digital board A and the driver circuit 14 of the X-Y driver board. And the power supply circuit 20 supplies these power supply voltages of various types to the various circuits, with the exception of the inverter circuit 24.

The inverter circuit 24 converts the DC power supply voltage supplied from the rectification circuit 22 to high frequency AC voltage. And, via an inverter harness not shown in the figures, the inverter circuit 24 supplies this AC voltage to the backlight of the LCD 26 as a drive signal, so as to illuminate the backlight.

Figure 3:
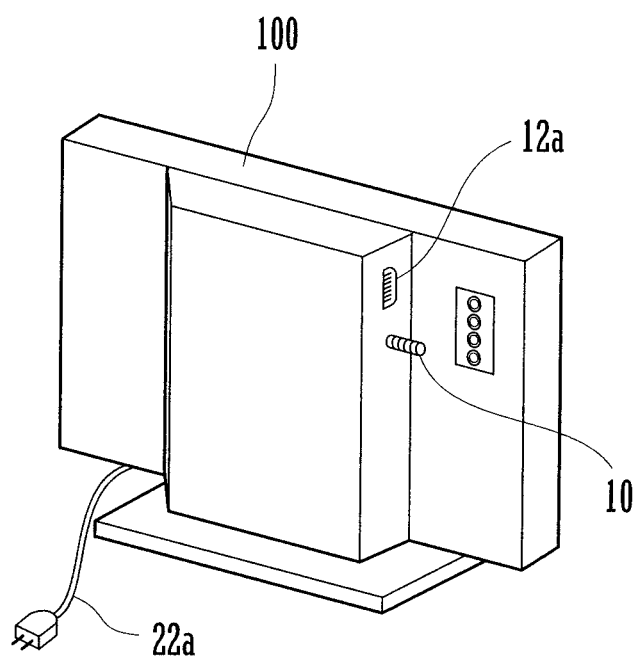
FIG. 3 is a perspective view of this liquid crystal television according to an embodiment of the present invention, as seen from the rear.

The board arrangement of this liquid crystal television 100 will now be explained with reference to FIGS. 3 and 4. FIG. 3 is a rear perspective view of this liquid crystal television 100. And FIG. 4 shows the arrangement of boards inside the rear of the LCD 26 of this liquid crystal television 100.

Figure 4:
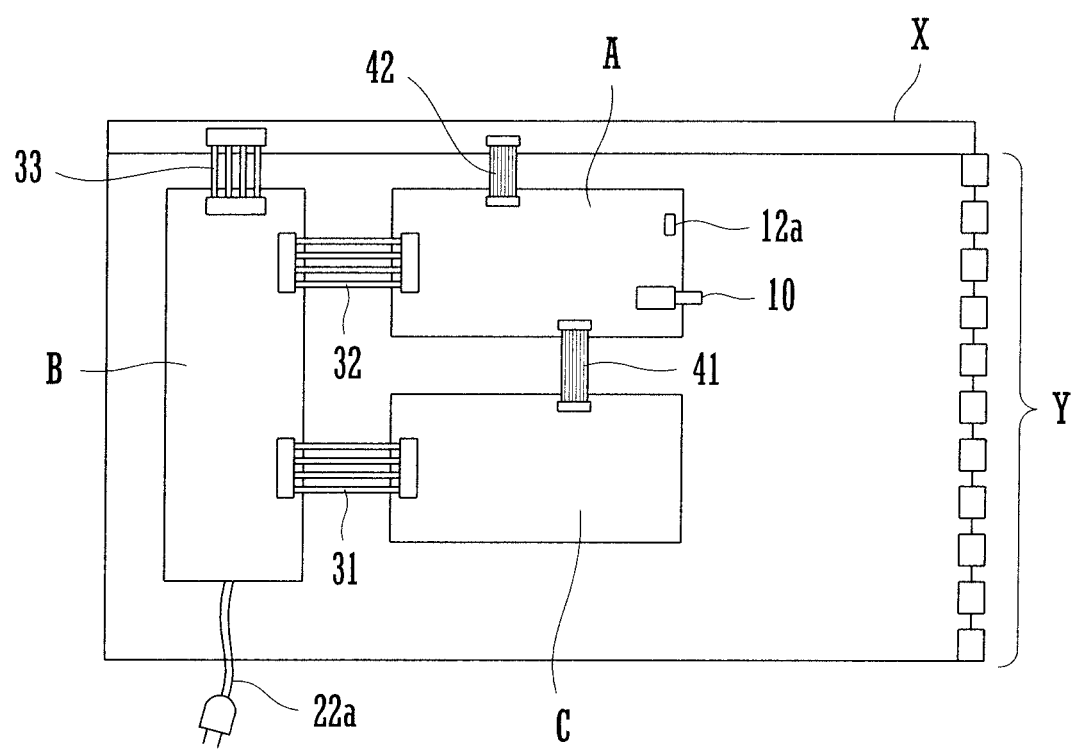
FIG. 4 shows an arrangement of boards inside the rear of this liquid crystal television that is an embodiment of the present invention.

The rear surface of the LCD 26 shown in FIG. 4 is covered over with a back plate that constitutes one portion of the casing of the liquid crystal television 100 (refer to FIG. 3). With this back plate removed, the digital board A, the power supply board B, the audio board C, the driver board X, and the TCP group Y can be seen, arranged as shown in FIG. 4. In the following, the positional relationships of these various boards and the circuitry to which these boards are mounted will be explained.

It should be understood that the driver board X and the TCP group Y correspond to the "driver board" of the Claims. This type of TCP is also sometimes called a COF (chip on film) type. The inverter circuit 24, the rectification circuit 22, and the power supply circuit 20 are mounted to the power supply board B, which is arranged on the left side of the rear of the LCD 26, and is oriented with its longer dimension extending along the vertical direction. The power supply board B converts the commercial AC power supply voltage into a DC power supply voltage. And the power supply board B generates power supply voltages of various types on the basis of this DC power supply voltage, and then supplies these various power supply voltages via various power supply cables to the circuits that are formed upon the audio board C, the digital board A, the driver board X, and so on. Here, the digital board A is connected to the power supply board B via a power supply cable 32. Moreover, the driver board X is connected to the power supply board B via a power supply cable 33. Furthermore, the audio board C is connected to the power supply boar B via a power supply cable 31.

The digital board A is disposed at the upper center of the rear surface of the LCD 26. The video signal processing circuit 12 is mounted to this digital board A, and a HDMI terminal 12a, a composite terminal, and the tuner 10 are provided thereupon. From a broadcast television signal received via the antenna 10a, the digital board A extracts the broadcast television signal of a channel that is selected with the tuner 10. And the digital board A performs separation of the video signal and the audio signal from this broadcast television signal with the signal processing circuit 12. Moreover, the digital board A outputs the audio signal that has thus been separated to the audio board C via a signal cable 41. Furthermore, on the basis of the video signal that has thus been separated, the digital board A generates one screen of image data for the LCD 26, and generates a panel drive signal on the basis of this image data. The digital board A is connected to the driver board X via a signal cable 42, and transmits this panel drive signal that it has generated to the driver board X via the signal cable 42.

The driver board X is positioned along the upper edge of the rear surface of the LCD 26, and the gamma circuit 13 and the driver circuit 14 are mounted thereupon. A plurality of source driver ICs of the driver circuit 14 are mounted to the driver board X, and that board X is connected to the TPC group Y upon which a plurality of gate drivers of the driver circuit 14 are mounted. A single gate driver IC is mounted upon each element of the TCP group Y. The driver circuit 14 that is formed upon the driver board X and the TCP group Y drives each of the pixels of the LCD 26 on the basis of the panel drive signal. Due to this, image data is displayed upon the screen of the LCD 26 on the basis of the video signal.

The audio processing circuit 16 is mounted to the audio board C, and is disposed next to the digital board A and underneath it, in other words at the lower central portion of the rear surface of the LCD 26. This audio board C is connected to the digital board A via the signal cable 41, and inputs the audio signal from the digital board A. The audio board C D/A converts the digital audio signal into an analog audio signal, which it outputs from the speaker 18.

The driver circuit 14 described above has a different circuit structure for each liquid crystal panel manufacturer and for each different liquid crystal panel screen size. In this embodiment, the DC power supply voltage that is generated by the power supply board B is directly supplied to the plurality of source driver ICs of the driver board X, and does not pass via the digital board A. Moreover, this DC power supply voltage is supplied to the plurality of gate driver ICs of the TCP group Y via the driver board X. Furthermore, the gamma circuit 13 that performs gamma correction is formed upon the driver board X. Due to this, when a liquid crystal panel that has been made by a different manufacturer is to be fitted, or when a liquid crystal panel of a different screen size is to be fitted, it is sufficient only to change over the driver board X and the TCP group Y. In other words, it is not necessary to design any dedicated digital board A separately. Accordingly, with this embodiment, it is possible to standardize the digital board A, and thus it is possible to anticipate reduction of the cost of manufacture.

The following variant of the embodiment of the present is invention described above may also be employed.

Figure 5:
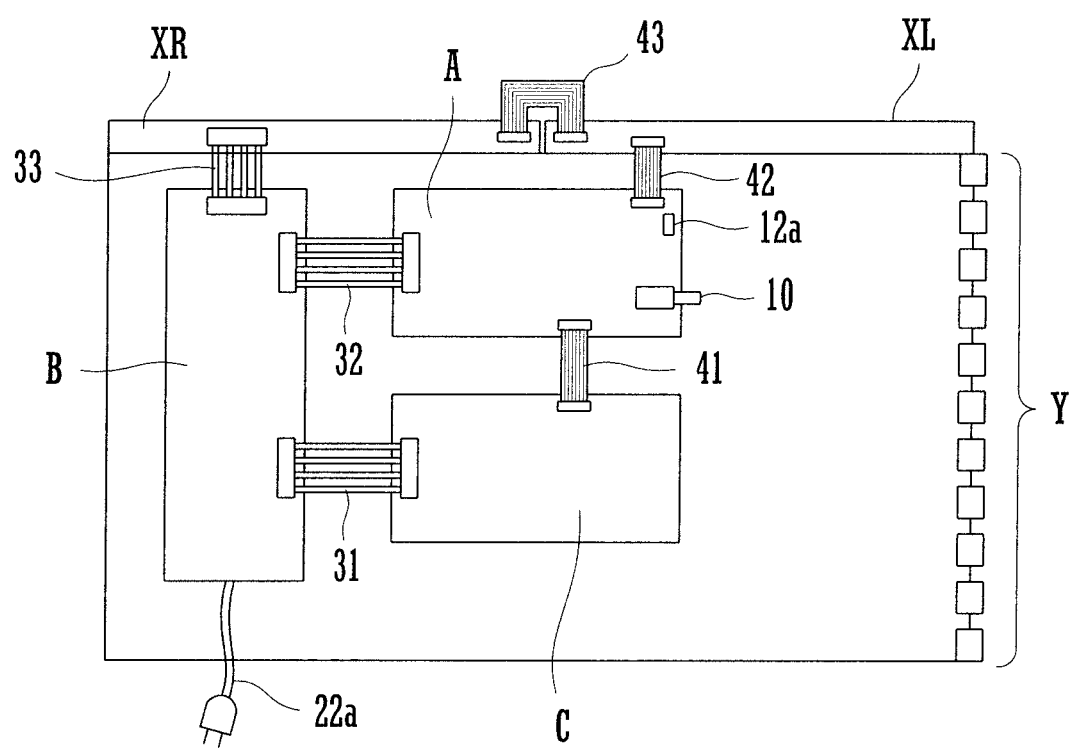
FIG. 5 shows an arrangement of boards inside the rear of a liquid crystal television that is a variant embodiment of the present invention.

FIG. 5 is a figure showing the board arrangement inside the rear of a liquid crystal television that is a variant embodiment of the present invention. The aspect in which the board configuration shown in FIG. 5 is different from the board configuration shown in FIG. 4, is that the driver board is separated into two driver boards XR and XL. If the size of the liquid crystal panel screen is 50 inches or more, then sometimes it is appropriate to apportion the source bus lines of the LCD 26 between two or more driver boards, such as these boards XR and XL.

The driver board XR and the driver board XL of this variant embodiment are connected together by a cable 43. The gamma circuit 13 is formed upon the driver board XL. Furthermore, sections of the driver circuit 14 are mounted to the driver board XR, to the driver board XL, and to the TCP group Y. In detail, the plurality of source drivers IC are mounted upon the driver board XR and also upon the driver board XL, and these are connected to the TCP group Y, upon which the plurality of gate driver ICs of the driver circuit 14 are mounted.

It should be understood that, in this implementation, the gamma circuit 13 may also be formed upon the driver board XR. And the DC power supply voltage that is generated by the power supply board B is supplied to the driver board XR via the power supply cable 33, and is also supplied via the cable 43 to the driver board XL. Moreover, this DC power supply voltage is also supplied to the TCP group Y via the driver board XL. Furthermore, the panel drive signal generated by the digital board A is inputted to the driver board XL via the signal cable 42, and is inputted to the driver board XR via the cable 43. Yet further, the panel drive signal is inputted to the TCP group Y via the driver board XL. And, on the basis of the panel drive signal, the driver board XR, the driver board XL, and the TCP group Y drive the pixels of the LCD 26.

With this variant embodiment as well, the DC power supply voltage generated by the power supply board B is supplied to the driver board XR and the driver board XL directly, rather than via the digital board A. Furthermore, this DC power supply voltage is supplied to the TCP group Y via the driver board XL. Yet further, the gamma circuit 13 that performs gamma correction is formed upon the driver board XL. Due to this, when a liquid crystal panel that has been made by a different manufacturer is to be fitted, or when a liquid crystal panel of a different screen size is to be fitted, it is sufficient only to change over the driver board XR, the driver board XL, and the TCP group Y. In other words, it is not necessary to design any dedicated digital board A separately. Accordingly, with this variant embodiment as well, it is possible to standardize the digital board A, and thus it is possible to anticipate reduction of the cost of manufacture.

What is claimed is:

1. A display device, comprising:

a digital board upon which is formed a video signal processing circuit that generates one screen of image data on the basis of a video signal that is inputted from an input source, and generates a drive signal on the basis of the image data;

a source driver board that is connected to the digital board by a signal cable, and upon which is formed a source driver circuit that drives each pixel of a display on the basis of the drive signal inputted from the digital board via the signal cable, thus displaying upon the display an image based upon the image data;

a gate driver board that is connected to the source driver board, and upon which is formed a gate driver circuit that drives each pixel of a display on the basis of the drive signal inputted from the digital board via the signal cable and the source driver board; and a power supply board upon which is formed a power supply circuit that produces a power supply voltage from a commercial power supply, wherein the source driver board comprises a first source driver board and a second source driver board, wherein the first source driver board is connected to the second source driver board via a cable, wherein the digital board is connected to the power supply board via a first power supply cable, wherein the first source driver board is connected to the power supply board via a second power supply cable, and wherein the power supply board:

supplies the power supply voltage to the digital board via the first power supply cable;

supplies the power supply voltage to the first source driver board via the second power supply cable;

supplies the power supply voltage to the second source driver board via the first source driver board and the cable; and supplies the power supply voltage to the gate driver board via the second source driver board.

2. The display device according to claim 1, wherein a gamma circuit that performs gamma correction upon the drive signal inputted from the digital board via the signal cable is formed upon the first source driver board and the second source driver board, and wherein after the gamma correction has been performed by the gamma circuit, the source driver circuit and the gate driver circuit drive the pixels of the display on the basis of the drive signal, and display an image based upon the image data upon the display.

3. The display device according to claim 1, wherein the display is a liquid crystal display that includes a pixel array, and wherein the source driver circuit and the gate driver circuit drive the pixels of the liquid crystal display on the basis of the drive signal, and thus displays an image based upon the image data upon the screen of the liquid crystal display.

* * * * *